United States Patent
Lin et al.

(10) Patent No.: US 12,537,537 B2
(45) Date of Patent: Jan. 27, 2026

(54) ANALOG-TO-DIGITAL CONVERSION APPARATUS AND METHOD HAVING DYNAMIC GAIN COMPENSATION MECHANISM

(71) Applicant: REALTEK SEMICONDUCTOR CORPORATION, Hsinchu (TW)

(72) Inventors: Kai-Yue Lin, Hsinchu (TW); Wei-Jyun Wang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 141 days.

(21) Appl. No.: 18/613,185

(22) Filed: Mar. 22, 2024

(65) Prior Publication Data

US 2024/0322832 A1 Sep. 26, 2024

(30) Foreign Application Priority Data

Mar. 24, 2023 (TW) .................................. 112111195

(51) Int. Cl.
*H03M 1/06* (2006.01)
(52) U.S. Cl.
CPC ................................. *H03M 1/0604* (2013.01)
(58) Field of Classification Search
CPC ............ H03M 1/06; H03M 1/10; H03M 1/12; H03M 1/0604; H03M 1/164; H03M 1/1019
See application file for complete search history.

(56) References Cited

U.S. PATENT DOCUMENTS

| | | | | |
|---|---|---|---|---|
| 6,970,120 B1 * | 11/2005 | Bjornsen | ................. | H03M 3/38 341/120 |
| 7,277,033 B1 * | 10/2007 | Kriz | ........................ | H03M 1/06 341/131 |
| 8,274,419 B2 * | 9/2012 | Gicquel | ................ | H03M 1/164 341/172 |

(Continued)

OTHER PUBLICATIONS

Antonio J. Ginés et al., "Digital Background Gain Error Correction in Pipeline ADCs", 2004 IEEE.

(Continued)

*Primary Examiner* — Lam T Mai
(74) *Attorney, Agent, or Firm* — WPAT, PC

(57) ABSTRACT

The present disclosure discloses an analog-to-digital conversion apparatus. A first stage conversion circuit receives an analog input signal to generate a digital conversion result. A second stage conversion circuit calculates an analog residue between the analog input signal and the digital conversion result and feeds a pseudo-noise to generate and amplify a feeding result to generate a digital residue for a gain calculation circuit to perform correlation calculation with the pseudo-noise to generate a compensation gain. A control circuit controls the first stage conversion circuit to operate according to output resolutions to establish a look-up table for a compensation gain generation circuit to look up to retrieve one of the interval gain values as a compensation gain value. An output calculation circuit compensates an added result of the digital conversion result and the pseudo-noise to further add a compensation result with the digital residue to generate a digital output signal.

14 Claims, 3 Drawing Sheets

(56) References Cited

U.S. PATENT DOCUMENTS

| | | | |
|---|---|---|---|
| 8,384,571 B2* | 2/2013 | Danjo | H03M 1/1038 341/120 |
| 9,231,611 B2* | 1/2016 | Steensgaard-Madsen | H03M 1/0668 |
| 9,281,831 B2 | 3/2016 | Marie et al. | |
| 10,044,361 B1* | 8/2018 | Tsai | H03F 3/45 |
| 10,103,753 B1* | 10/2018 | Nagarajan | H03M 13/39 |
| 10,608,655 B1* | 3/2020 | Li | H03M 1/1057 |
| 11,171,662 B1* | 11/2021 | Steensgaard-Madsen | H03M 1/468 |
| 11,177,821 B1* | 11/2021 | Steensgaard-Madsen | H03F 3/38 |
| 11,876,526 B2* | 1/2024 | Huang | H03M 1/145 |
| 2003/0006926 A1* | 1/2003 | Nikai | H03M 1/18 341/161 |
| 2003/0184464 A1* | 10/2003 | Nakamura | H03M 1/129 341/155 |
| 2003/0193425 A1* | 10/2003 | Chou | H03M 1/164 341/162 |
| 2014/0191889 A1* | 7/2014 | Haneda | H03M 1/069 341/118 |
| 2014/0320328 A1* | 10/2014 | Moazzami | H03M 1/1245 341/155 |
| 2015/0188555 A1* | 7/2015 | Kimura | H03M 1/002 341/118 |
| 2015/0256189 A1* | 9/2015 | Marie | H03M 1/002 341/118 |
| 2016/0087643 A1* | 3/2016 | Nozaki | H03M 1/0836 341/118 |
| 2022/0337259 A1* | 10/2022 | Huang | H03M 1/468 |
| 2024/0113720 A1* | 4/2024 | Huang | H03M 1/1215 |

OTHER PUBLICATIONS

EJ Siragusa et al.., "Gain error correction technique for pipelined", Mar. 30, 2000, Electronics Letters.

* cited by examiner

ANALOG-TO-DIGITAL CONVERSION APPARATUS AND METHOD HAVING DYNAMIC GAIN COMPENSATION MECHANISM

BACKGROUND OF THE INVENTION

1. Field of the Invention

The present disclosure relates to an analog-to-digital conversion apparatus and an analog-to-digital conversion method having dynamic gain compensation mechanism.

2. Description of Related Art

In a pipeline analog-to-digital conversion apparatus, there is an amplification circuit in each of a plurality of stages of circuits to amplify a residue signal, which is also known as a residue voltage. A digital code generated by each of the stages of circuits is required to multiply by a value that is certain times of a gain parameter of the amplification circuit.

The gain parameter of the amplification circuit may be affected by environmental factors or different signal intensities. Without an appropriate compensation mechanism, the output accuracy of the analog-to-digital conversion apparatus will be affected.

SUMMARY OF THE INVENTION

In consideration of the problem of the prior art, an object of the present disclosure is to provide an analog-to-digital conversion apparatus and an analog-to-digital conversion method having dynamic gain compensation mechanism.

The present invention discloses an analog-to-digital conversion apparatus having dynamic gain compensation mechanism that includes a first stage conversion circuit, a second stage conversion circuit, a gain calculation circuit, a control circuit, a compensation gain generation circuit and an output calculation circuit. The first stage conversion circuit is configured to receive and perform conversion on an analog input signal to generate a digital conversion result. The second stage conversion circuit is configured to calculate an analog residue between the analog input signal and the digital conversion result and feed a pseudo-noise to the analog residue to generate a feeding result, so as to perform amplification on the feeding result according to a gain parameter to generate a digital residue. The gain calculation circuit is configured to perform correlation calculation on the pseudo-noise and the digital residue to generate a compensation gain corresponding to the gain parameter. The control circuit is configured to control the first stage conversion circuit to operate according to a plurality of first output resolutions, record a plurality of output code ranges of the digital residue and a plurality of gain values of the compensation gain, according to the output code ranges, set a plurality of output code intervals that are not overlapped with each other in a full output code range that a second output resolution of the second stage conversion circuit corresponds to and calculate a plurality of interval gain values corresponding to the output code intervals according to the gain values to further establish a look-up table between the output code intervals and the interval gain values accordingly. The compensation gain generation circuit is configured to determine one of the output code intervals that an output code amount of the digital residue locates to look up the look-up table to retrieve one of the interval gain values as a compensation gain value. The output calculation circuit is configured to add the digital conversion result and the pseudo-noise to obtain an added result, perform compensation on the added result according to the compensation gain value to obtain a compensated result and add the compensated result and the digital residue to generate a digital output signal.

The present invention also discloses an analog-to-digital conversion method having dynamic gain compensation mechanism that includes steps outlined below. An analog input signal is received and conversion is performed thereon to generate a digital conversion result by a first stage conversion circuit. An analog residue between the analog input signal and the digital conversion result is calculated and a pseudo-noise is fed to the analog residue to generate a feeding result by a second stage conversion circuit, so as to perform amplification on the feeding result according to a gain parameter to generate a digital residue. Correlation calculation is performed on the pseudo-noise and the digital residue to generate a compensation gain corresponding to the gain parameter by a gain calculation circuit. The first stage conversion circuit is controlled to operate according to a plurality of first output resolutions and a plurality of output code ranges of the digital residue and a plurality of gain values of the compensation gain are recorded by a control circuit. According to the output code ranges, a plurality of output code intervals that are not overlapped with each other in a full output code range that a second output resolution of the second stage conversion circuit corresponds to are set by the control circuit. A plurality of interval gain values corresponding to the output code intervals are calculated according to the gain values to further establish a look-up table between the output code intervals and the interval gain values accordingly by the control circuit. One of the output code intervals that an output code amount of the digital residue locates is determined to look up the look-up table to retrieve one of the interval gain values as a compensation gain value by a compensation gain generation circuit. The digital conversion result and the pseudo-noise are added to obtain an added result, compensation is performed on the added result according to the compensation gain value to obtain a compensated result and the compensated result and the digital residue are added to generate a digital output signal by an output calculation circuit.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide an analog-to-digital conversion apparatus and an analog-to-digital conversion method having dynamic gain compensation mechanism to perform compensation on a gain parameter according to a compensation value determined by the amount of the analog residue by using a control circuit and a compensation gain generation circuit to obtain a more accurate analog-to-digital conversion result.

Figure 1:
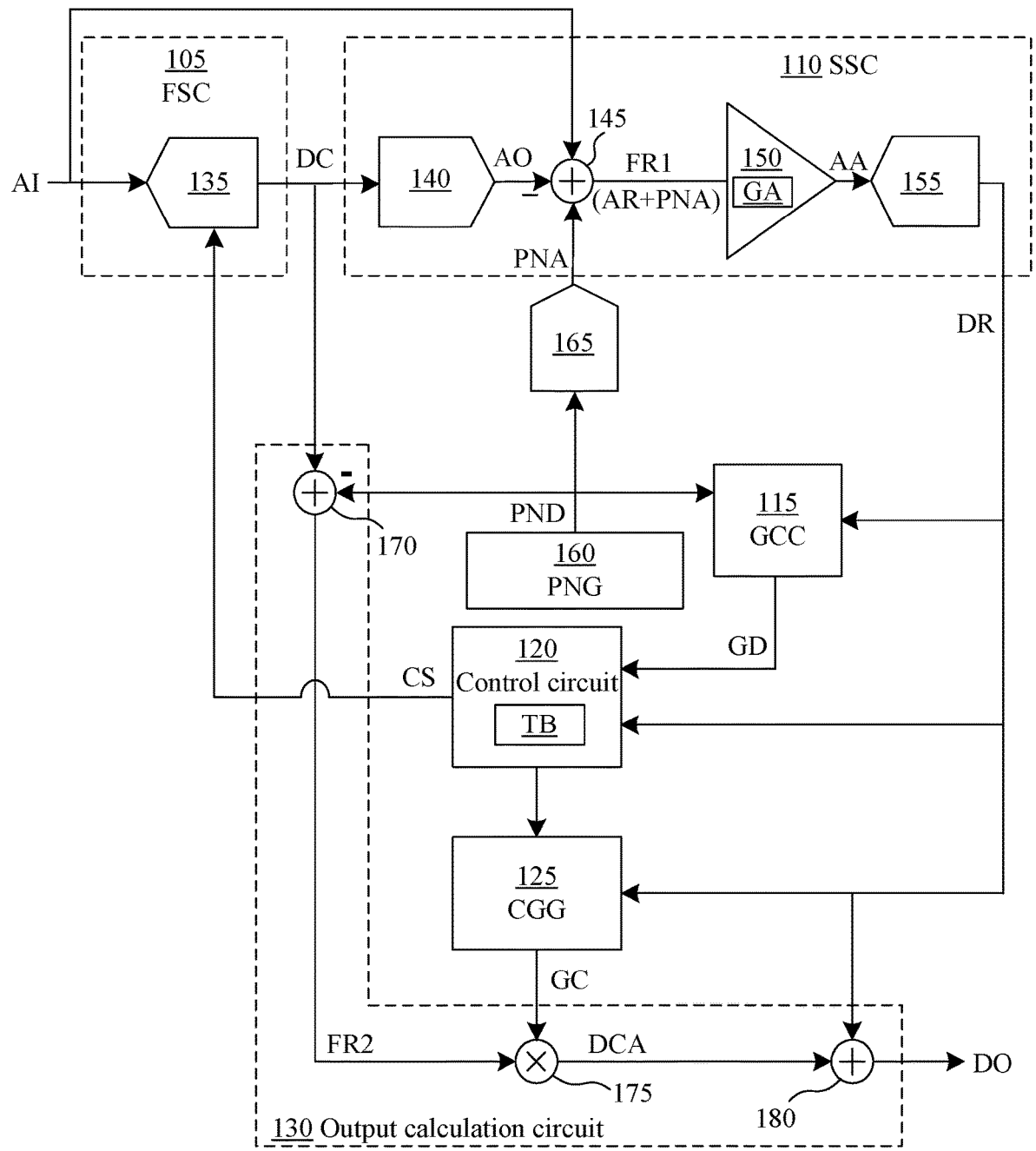
FIG. 1 illustrates a block diagram of analog-to-digital conversion apparatus having dynamic gain compensation mechanism according to an embodiment of the present invention.

Reference is now made to FIG. 1. FIG. 1 illustrates a block diagram of an analog-to-digital conversion apparatus 100 having dynamic gain compensation mechanism according to an embodiment of the present invention.

In an embodiment, the analog-to-digital conversion apparatus 100 is a pipeline analog-to-digital conversion apparatus and includes a first stage conversion circuit 105, a second stage conversion circuit 110, a gain calculation circuit 115, a control circuit 120, a compensation gain generation circuit 125 and an output calculation circuit 130.

The first stage conversion circuit 105 includes a first analog-to-digital conversion circuit 135 to receive and perform conversion on an analog input signal AI to generate a digital conversion result DC.

The second stage conversion circuit 110 calculates an analog residue AR between the analog input signal AI and the digital conversion result DC and feeds a pseudo-noise PNA to the analog residue AR to generate a feeding result (not illustrated in the figure), so as to perform amplification on the feeding result to according to a gain parameter GA and perform conversion subsequently to generate a digital residue DR.

In an embodiment, the second stage conversion circuit 110 includes a digital-to-analog conversion circuit 140, a residue calculation circuit 145, an amplification circuit 150 and a second analog-to-digital conversion circuit 155.

The digital-to-analog conversion circuit 140 performs conversion on the digital conversion result DC to generate an analog output signal AO.

The residue calculation circuit 145 calculates a difference between the analog output signal AO and the analog input signal AI to generate the analog residue AR, and further add the pseudo-noise PNA to the analog residue AR to generate a first added result FR1.

In some embodiments, the digital-to-analog conversion circuit 140, the residue calculation circuit 145 may be included in the first stage conversion circuit 105.

In some embodiments, the digital-to-analog conversion circuit 140 and the residue calculation circuit 145 can be merged to a single circuit block.

In an embodiment, the analog-to-digital conversion apparatus 100 further includes a pseudo-noise generation circuit 160 and a digital-to-analog conversion circuit 165. The pseudo-noise generation circuit 160 generates a pseudo-noise PND having a digital form, and the pseudo-noise PND is a one-bit signal including a series of randomly generated 0s and 1s. The digital-to-analog conversion circuit 165 performs conversion on the pseudo-noise PND to generate the pseudo-noise PNA having an analog form, such that the residue calculation circuit 145 receives the pseudo-noise PNA having the analog form.

The amplification circuit 150 amplifies the first added result FR1 according to the gain parameter GA to generate an analog amplified signal AA.

The second analog-to-digital conversion circuit 155 performs conversion on the analog amplified signal AA to generate the digital residue DR.

The gain calculation circuit 115 performs correlation calculation on the pseudo-noise PND and the digital residue DR to generate a compensation gain GD corresponding to the gain parameter GA. The pseudo-noise generation circuit 160 allows the gain calculation circuit 115 to receive the pseudo-noise PND in the digital form.

In an embodiment, the gain calculation circuit 115 may use the method described in the thesis "Digital Background Gain Error Correction in Pipeline ADCs" published in IEEE in 2004, in which a correlation is calculated by multiply the pseudo-noise PND by the digital residue DR, a certain pieces of calculated correlation data are accumulated subsequently to be averaged and a correction is performed on the averaged value by using such as but not limited to a predetermined constant to generate the compensation gain GD.

The control circuit 120 controls the first stage conversion circuit 105 to operate according to a plurality of first output resolutions, and records a plurality of output code ranges of the digital residue DR and a plurality of gain values of the compensation gain GA.

Each of the first output resolutions is an amount of bits of the digital conversion result DC outputted by the first stage conversion circuit 105. More specifically, each of the first output resolutions is an amount of bits that the first stage conversion circuit 105 uses to quantize the analog input signal AI.

When a first output resolution is higher, the amount of the bits of the digital conversion result DC is larger, in which the first stage conversion circuit 105 quantizes the analog input signal AI with a higher resolution. When a first output resolution is lower, the amount of the bits of the digital conversion result DC is lower, in which the first stage conversion circuit 105 quantizes the analog input signal AI with a lower resolution.

As a result, the control circuit 120 may control the first stage conversion circuit 105 to operate according to different first output resolutions by such as, but not limited to generating a control signal CS. For each of the first output resolutions, the control circuit 120 further records the output code ranges of the digital residue DR and the gain values of the compensation gain GA corresponding thereto.

According to the output code ranges, the control circuit 120 sets a plurality of output code intervals that are not overlapped with each other in a full output code range that a second output resolution of the second stage conversion circuit 110 correspond to. The control circuit 120 further calculates a plurality of interval gain values corresponding to the output code intervals according to the gain values.

The second output resolution is an amount of bits of the digital residue DR outputted by the second stage conversion circuit 110. More specifically, the second output resolution is an amount of bits that the second stage conversion circuit 110 uses to quantize the analog amplified signal AA. During the operation of the analog-to-digital conversion apparatus 100, the second stage conversion circuit 110 keeps the same second output resolution. In a numerical example, the second output resolution is 8-bit such that the full output code range that the digital residue DR corresponds to is 0-255.

It is appreciated that, the signal range that the second stage conversion circuit 110 is able to receive is preferably being larger than or equaling to the largest possible signal value of the analog amplified signal AA such that all the possible signal values of the analog amplified signal AA can be quantized by the second stage conversion circuit 110 without being distorted.

Figure 2:
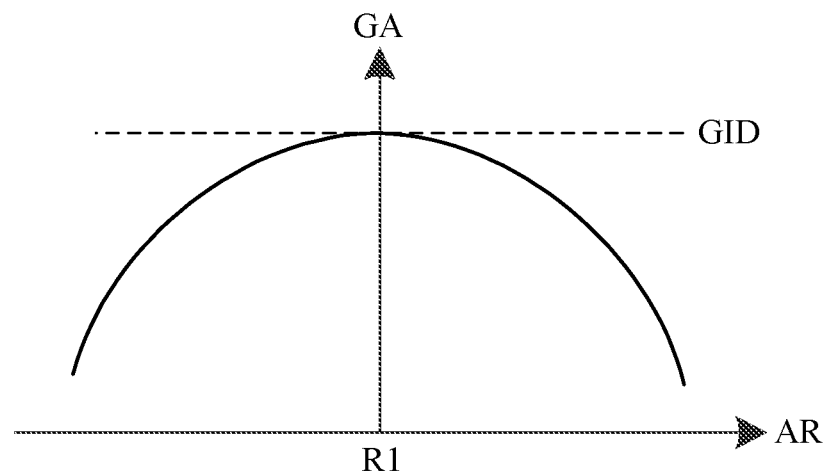
FIG. 2 illustrates a diagram of the relation between the analog residue and the gain parameter according to an embodiment of the present invention.

Reference is now made to FIG. 2. FIG. 2 illustrates a diagram of the relation between the analog residue AR and the gain parameter GA according to an embodiment of the present invention.

During the operation of the analog-to-digital conversion apparatus 100, the gain parameter GA is not an ideal constant value GID due to the influence of different signal amounts of the analog residue AR. More specifically, a curvilinear correlation similar to what the curve CU illustrated in FIG. 2 stands for may be presented between the analog residue AR and the gain parameter GA. As a result, when the analog residue AR has the value R1, the gain parameter GA has the largest value. When the analog residue AR gradually becomes larger than or smaller than the value R1, the gain parameter GA has a smaller value.

Since the digital residue DR is generated based on the calculation performed according to the analog residue AR and the gain parameter GA, the compensation gain GD generated based on the calculation performed according to the digital residue DR is affected as well. However, due to the calculation mechanism of the gain calculation circuit 115, the actual variation of the gain parameter GA can not be reflected on the compensation gain GD due to the averaging effect.

Figure 3:
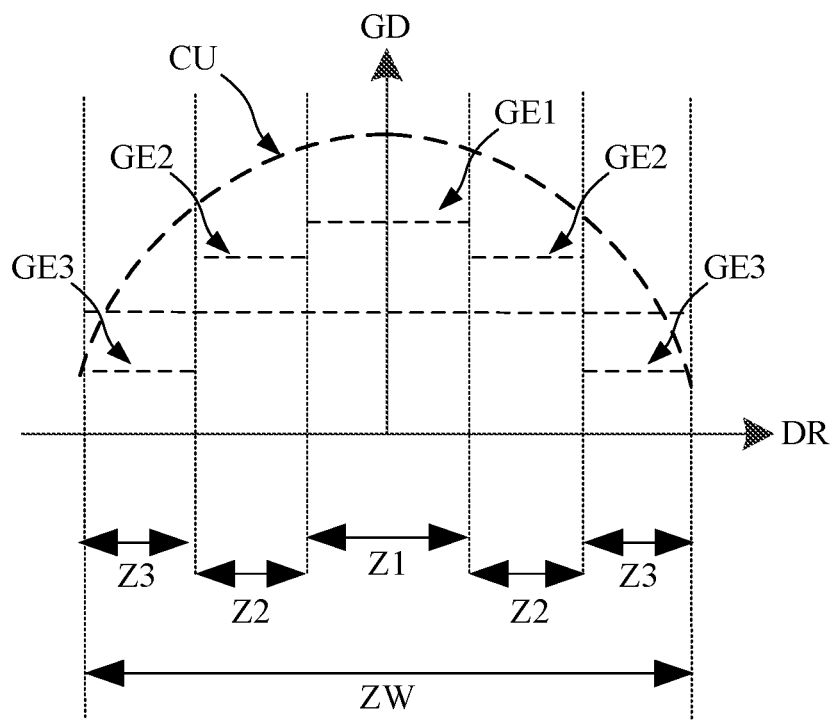
FIG. 3 illustrates a diagram of the output code intervals and the interval gain values corresponding to the output code intervals set by the control circuit according to an embodiment of the present invention.

Reference is now made to FIG. 3. FIG. 3 illustrates a diagram of the output code intervals and the interval gain values corresponding to the output code intervals set by the control circuit 120 according to an embodiment of the present invention.

In an embodiment, the 8-bit full output code range ZW (having the value range of 0-255) covers all the signal values of the analog residue AR. The control circuit 120 may set the output code intervals Z1-Z3, in which the output code interval Z1 is the centermost output code interval and the output code intervals Z2-Z3 are outwards output code intervals. Each of the outwards output code intervals Z2-Z3 includes a pair of sub-intervals disposed at two opposite sides of the centermost output code interval Z1. The outwards output code intervals Z2-Z3 are distributed in turn around the centermost output code interval Z1 that serves as a center.

Each of the output code intervals Z1-Z3 corresponds to one of a plurality of interval compensation gains. For example, the output code interval Z1 corresponds to an interval gain value GE1, the output code interval Z2 corresponds to an interval gain value GE2 and the output code interval Z3 corresponds to an interval gain value GE3. These output code intervals and the interval gain values approximate the curvilinear correlation (the curve CU) in FIG. 2. The interval gain values GE1, GE2 and GE3 can be estimated by using the operations described below in accompany with the gain calculation circuit 115. It is appreciated that the curve CU is illustrated by a dashed line in FIG. 3.

In an embodiment, the control circuit 120 controls the first stage conversion circuit 105 to operate from a highest output resolution of the first output resolutions to a lowest output resolution of the first output resolutions and record the output code ranges and the gain values in a sequential order. The control circuit 120, based on the sequential order, determines a range of each of output code intervals according to a boundary output code difference of corresponding two of the output code ranges and generates each of the interval gain values by performing calculation on at least one of the gain values of the corresponding two of the output code ranges and the boundary output code difference.

For example, when the control circuit 120 controls the first stage conversion circuit 105 to operation according to the highest resolution of the first output resolutions (e.g., N-bit), the output code range of the digital residue DR is 64-192 and the gain calculation circuit 115 calculates the gain value G1 that such a range corresponds to. When the control circuit 120 controls the first stage conversion circuit 105 to operate according to the second highest resolution of the first output resolutions (e.g., N-1-bit), the error becomes larger due to the decreasing of the resolution. The output code range of the digital residue DR becomes higher and is 94-222. The gain calculation circuit 115 calculates the gain value G2 that such a range corresponds to. Under such a condition, the boundary output code difference of these two output code ranges can be obtained either by subtracting the highest boundary values thereof (222-192) or by subtracting the lowest boundary values thereof (94-64), which is 30.

Along with the variation of the first output resolutions, different values of the gain parameter of the amplification circuit 150 occur such that the calculated gain value G2 has a difference from the calculated gain value G1.

In an embodiment, the control circuit 120 sets the output code range 64-192 corresponding to the highest resolution of the first output resolutions to be the output code interval Z1 and sets the gain value G1 to be the interval gain value GE1 of such a centermost output code interval Z1.

The control circuit 120 determines the range of the outwards output code intervals according to the boundary output code difference (30), such as but not limited to set the range of outwards output code interval Z2 having the pair of sub-intervals to be outside of the centermost output code interval Z1 and having the total range equaling to the boundary output code difference. As a result, the pair of sub-intervals of the outwards output code interval Z2 are 192-207 and 49-64, in which 207 is the result of the calculation of 192+30/2, and 49 is the result of the calculation of 64-30/2. The control circuit 120 further sets the gain value G2 to be the interval gain value GE2 that the outwards output code interval Z2 corresponds to.

As a result, by using the similar method, the control circuit 120 can record the output code ranges and the gain values when the first stage conversion circuit 105 operates according to the second highest resolution and the third highest resolution of the first output resolutions, determines the range of the subsequent outwards output code interval Z3 and calculates the corresponding interval gain value GE3.

It is appreciated that the determining of the output code intervals described above is merely an example. In practical implementation, the selection of the range of the intervals and the calculation of the gain values corresponding thereto can be different according to characteristics of different amplifiers. The present invention is not limited to a specific selection method of the range of the intervals and a specific calculation method of the gain values.

For example, the control circuit 120 may use a centermost output code of the full output code range that the second output resolution of the second stage conversion circuit 110 corresponds to (e.g., 127 or 128 from the range 0-255) as a starting point, to set the output code interval Z1 according to the boundary output code difference between the output code ranges under the conditions that the first stage conversion circuit 105 operates according to the first highest resolution of the first output resolutions and the second highest resolution of the first output resolutions. For the numerical example described above, the control circuit 120 may set a range of 30 output codes around the centermost output code 128, i.e., 128−15=113 and 128+15=143, to be the output code interval Z1. By using the similar method, the control circuit 120 may set the output code interval Z2 according to the boundary output code difference between the output code ranges under the conditions that the first stage conversion circuit 105 operates according to the second highest resolution of the first output resolutions and the third highest resolution of the first output resolutions.

Similarly, the calculation of the gain values described above is merely an example. In other embodiments, the control circuit 120 may selectively use a ratio relation between the boundary output code difference and the output code interval Z1 as weights to perform weighting on the gain value G1 and the gain value G2 to generate the interval gain value GE2 of the outwards output code interval Z2.

Moreover, the amount of the output code intervals illustrated in FIG. 3 is merely an example. In other embodiments, the control circuit 120 may set more output code intervals according to the operation based on more different resolutions of the first output resolutions to closely approximate the curvilinear correlation of the amplifier under the condition that more output code intervals are presented.

In some embodiments, the interval gain value and the boundary values of each of the intervals can be derived by applying other calculations on the gain values and the boundary values calculated according to the operation of any one of the first output resolutions. For example, the first stage conversion circuit may operate according to the first output resolutions of N, N−1 and N−2. The control circuit obtains at least three groups of boundary values and gain values that are either the same or different. The user may divide the digital residue DR into more than three intervals by linear interpolation or other calculation methods according to the characteristic of the amplifier 150 to increase the accuracy of the operation.

According to the relation between the output code intervals Z1-Z3 and the interval gain values GE1-GE3, the control circuit 120 establishes a look-up table TB between the output code intervals and the interval gain values.

The compensation gain generation circuit 125 one of the output code intervals that an output code amount of the digital residue DR locates to look up the look-up table TB to retrieve one of the interval gain values as a compensation gain value GC. For example, when the output code amount of the digital residue DR locates in the output code interval Z2, the compensation gain generation circuit 125 looks up the look-up table TB accordingly to retrieve the interval gain values GE2 as the compensation gain value GC.

The output calculation circuit 130 adds the digital conversion result DC and the pseudo-noise PND to obtain an added result, perform compensation on the added result according to the compensation gain value GC to obtain a compensated result and add the compensated result and the digital residue DR to generate a digital output signal DO.

In an embodiment, the output calculation circuit 130 includes aa first adder 170, a compensation calculation circuit 175 and a second adder 180.

The first adder 170 adds the digital conversion result DC and the pseudo-noise PND to generate a second added result FR2. The pseudo-noise generation circuit 160 allows the first adder 170 to receive the pseudo-noise PND in the digital form.

The compensation calculation circuit 175 amplifies the second added result FR2 according to the compensation gain value GC to generate an amplified digital conversion result DCA.

The second adder 180 adds the amplified digital conversion result DCA and the digital residue DR to generate the digital output signal DO.

The gain parameter GA varies due to the effect of the temperature or manufacturing process during the operation of the analog-to-digital conversion apparatus 100 to further affect the amount of the digital residue. Such a variation can be compensated by the compensation gain GD calculated by the gain calculation circuit 115. However, due to the averaging calculation mechanism, the gain calculation circuit 115 is not able to compensate the effect of the signal amount of the analog residue AR on the gain parameter GA according to the generation of the compensation gain GD.

As a result, by using the control circuit 120, the analog-to-digital conversion apparatus 100 of the present invention can control the first stage conversion circuit 105 to operate according to different resolutions such that the second stage conversion circuit 110 generates different output code ranges and gain values. The interval gain values of the second stage conversion circuit 110 corresponding to different output code intervals can be calculated to approximate the curvilinear correlation between the gain parameter GA and the analog residue AR such that the look-up table TB is established accordingly.

The compensation gain generation circuit 125 further looks up the look-up table TB according to the output code amount of the digital residue DR to retrieve the corresponding interval gain value as the compensation gain value to compensate the digital conversion result DC (in the present embodiment, the compensation is actually performed on the second added result FR2, i.e., the added result of the digital conversion result DC and the pseudo-noise PND). The compensated digital conversion result DC is further added to the digital residue DR to obtain a more accurate analog-to-digital conversion result.

It is appreciated that since the variation of the temperature or manufacturing process still influence the gain parameter GA, the control circuit 120 may keep updating look-up table TB according to the generation of the digital residue DR. Further, the update of the look-up table TB may be performed simultaneously with the generation of the digital output signal DO by the analog-to-digital conversion apparatus 100.

Moreover, two stages of conversion circuits are used as an example in the analog-to-digital conversion apparatus 100 in FIG. 1. In practical implementation, the analog-to-digital conversion apparatus 100 may include more than two stages of conversion circuits, in which each of the stage of the conversion circuits can use the digital conversion result of a previous stage of conversion circuit as the input to calculate the residue value to be added with the digital conversion result DC. The compensation mechanism described above can thus be applied. The present invention is not limited thereto.

Figure 4:
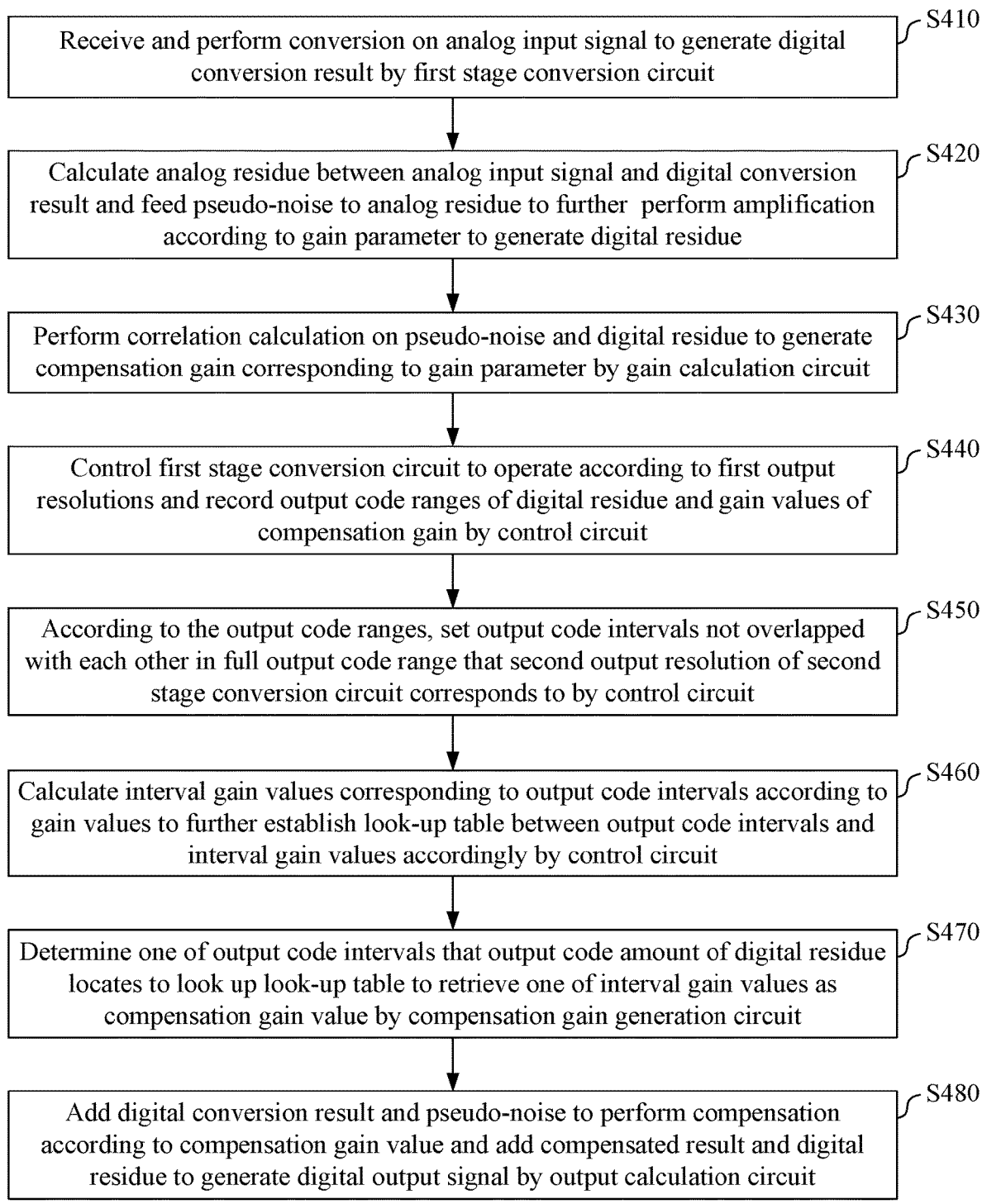
FIG. 4 illustrates a flow chart of an analog-to-digital conversion method having dynamic gain compensation mechanism according to an embodiment of the present invention.

Reference is now made to FIG. 4. FIG. 4 illustrates a flow chart of an analog-to-digital conversion method 400 having dynamic gain compensation mechanism according to an embodiment of the present invention.

Besides the apparatus described above, the present invention further discloses the analog-to-digital conversion method 400 that can be used in such as, but not limited to the analog-to-digital conversion apparatus 100 illustrated in FIG. 1. An embodiment of the analog-to-digital conversion method 400 is illustrated in FIG. 4 and includes the steps outlined below.

In step S410, the analog input signal AI is received and conversion is performed thereon to generate the digital conversion result DC by the first stage conversion circuit 105.

In step S420, the analog residue AR between the analog input signal AI and the digital conversion result DC is calculated and the pseudo-noise PNA is fed to the analog residue AR to generate the feeding result by the second stage conversion circuit 110, so as to perform amplification on the feeding result according to the gain parameter GA to generate the digital residue DR.

In step S430, correlation calculation is performed on the pseudo-noise PND and the digital residue DR to generate the compensation gain GD corresponding to the gain parameter GA by the gain calculation circuit 115.

In step S440, the first stage conversion circuit 105 is controlled to operate according to the first output resolutions and the output code ranges of the digital residue DR and the gain values of the compensation gain GD are recorded by the control circuit 120.

In step S450, according to the output code ranges, the output code intervals that are not overlapped with each other in the full output code range that the second output resolution of the second stage conversion circuit 110 corresponds to are set by the control circuit 120.

In step S460, the interval gain values corresponding to the output code intervals are calculated according to the gain values to further establish the look-up table TB between the output code intervals and the interval gain values accordingly by the control circuit 120.

In step S470, one of the output code intervals that the output code amount of the digital residue DR locates is determined to look up the look-up table TB to retrieve one of the interval gain values as the compensation gain value GC by the compensation gain generation circuit 125.

In step S480, the digital conversion result DC and the pseudo-noise PND are added to obtain the added result, compensation is performed on the added result according to the compensation gain value GC to obtain the compensated result and the compensated result and the digital residue DR are added to generate the digital output signal DO by the output calculation circuit 130.

It is appreciated that the embodiments described above are merely an example. In other embodiments, it is appreciated that many modifications and changes may be made by those of ordinary skill in the art without departing, from the spirit of the invention.

In summary, the analog-to-digital conversion apparatus and the analog-to-digital conversion method having dynamic gain compensation mechanism perform compensation on a gain parameter according to a compensation value determined by the amount of the analog residue by using a control circuit and a compensation gain generation circuit to obtain a more accurate analog-to-digital conversion result.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. An analog-to-digital conversion apparatus having dynamic gain compensation mechanism, comprising:
    a first stage conversion circuit configured to receive and perform conversion on an analog input signal to generate a digital conversion result;
    a second stage conversion circuit configured to calculate an analog residue between the analog input signal and the digital conversion result and feed a pseudo-noise to the analog residue to generate a feeding result, so as to perform amplification on the feeding result according to a gain parameter to generate a digital residue;
    a gain calculation circuit configured to perform correlation calculation on the pseudo-noise and the digital residue to generate a compensation gain corresponding to the gain parameter;
    a control circuit configured to:
        control the first stage conversion circuit to operate according to a plurality of first output resolutions;
        record a plurality of output code ranges of the digital residue and a plurality of gain values of the compensation gain;
        according to the output code ranges, set a plurality of output code intervals that are not overlapped with each other in a full output code range that a second output resolution of the second stage conversion circuit corresponds to; and
        calculate a plurality of interval gain values corresponding to the output code intervals according to the gain values to further establish a look-up table between the output code intervals and the interval gain values accordingly;
    a compensation gain generation circuit configured to determine one of the output code intervals that an output code amount of the digital residue locates to look up the look-up table to retrieve one of the interval gain values as a compensation gain value; and
    an output calculation circuit configured to add the digital conversion result and the pseudo-noise to obtain an added result, perform compensation on the added result according to the compensation gain value to obtain a compensated result and add the compensated result and the digital residue to generate a digital output signal.

2. The analog-to-digital conversion apparatus of claim 1, wherein the first stage conversion circuit comprises a first analog-to-digital conversion circuit, and the second stage conversion circuit comprises:
    a digital-to-analog conversion circuit configured to perform conversion on the digital conversion result to generate an analog output signal;
    a residue calculation circuit configured to calculate a difference between the analog output signal and the analog input signal to generate the analog residue, and further add the pseudo-noise to the analog residue to generate a first added result;
    an amplification circuit configured to amplify the first added result according to the gain parameter to generate an analog amplified signal; and
    a second analog-to-digital conversion circuit configured to perform conversion on the analog amplified signal to generate the digital residue.

3. The analog-to-digital conversion apparatus of claim 1, further comprising a pseudo-noise generation circuit configured to generate the pseudo-noise such that the second stage conversion circuit receives the pseudo-noise in an analog form, and the gain calculation circuit and the output calculation circuit receive the pseudo-noise in a digital form.

4. The analog-to-digital conversion apparatus of claim 1, wherein the output calculation circuit comprises:
- a first adder configured to add the digital conversion result and the pseudo-noise to generate a second added result;
- a compensation calculation circuit configured to amplify the second added result according to the compensation gain value to generate an amplified digital conversion result; and
- a second adder configured to add the amplified digital conversion result and the digital residue to generate the digital output signal.

5. The analog-to-digital conversion apparatus of claim 1, wherein the gain parameter and the analog residue has a curvilinear correlation therebetween, and the output code intervals and the interval gain values are configured to approximate the curvilinear correlation.

6. The analog-to-digital conversion apparatus of claim 5, wherein the output code intervals comprise a centermost output code interval and a plurality of outwards output code intervals, each of outwards output code intervals comprises a pair of sub-intervals disposed at two opposite sides of the centermost output code interval;
- the outwards output code intervals are distributed in turn around the centermost output code interval that serves as a center; and
- each of the output code intervals corresponds to one of the interval gain values.

7. The analog-to-digital conversion apparatus of claim 6, wherein the control circuit controls the first stage conversion circuit to operate from a highest output resolution of the first output resolutions to a lowest output resolution of the first output resolutions and record the output code ranges and the gain values in a sequential order;
- the control circuit, based on the sequential order, determines a range of each of output code intervals according to a boundary output code difference of corresponding two of the output code ranges and generates each of the interval gain values by performing calculation on at least one of the gain values of the corresponding two of the output code ranges and the boundary output code difference.

8. An analog-to-digital conversion method having dynamic gain compensation mechanism, comprising:
- receiving and performing conversion on an analog input signal to generate a digital conversion result by a first stage conversion circuit;
- calculating an analog residue between the analog input signal and the digital conversion result and feeding a pseudo-noise to the analog residue to generate a feeding result by a second stage conversion circuit, so as to perform amplification on the feeding result according to a gain parameter to generate a digital residue;
- performing correlation calculation on the pseudo-noise and the digital residue to generate a compensation gain corresponding to the gain parameter by a gain calculation circuit;
- controlling the first stage conversion circuit to operate according to a plurality of first output resolutions and recording a plurality of output code ranges of the digital residue and a plurality of gain values of the compensation gain by a control circuit;
- according to the output code ranges, setting a plurality of output code intervals that are not overlapped with each other in a full output code range that a second output resolution of the second stage conversion circuit corresponds to by the control circuit;
- calculating a plurality of interval gain values corresponding to the output code intervals according to the gain values to further establish a look-up table between the output code intervals and the interval gain values accordingly by the control circuit;
- determining one of the output code intervals that an output code amount of the digital residue locates to look up the look-up table to retrieve one of the interval gain values as a compensation gain value by a compensation gain generation circuit; and
- adding the digital conversion result and the pseudo-noise to obtain an added result, performing compensation on the added result according to the compensation gain value to obtain a compensated result and adding the compensated result and the digital residue to generate a digital output signal by an output calculation circuit.

9. The analog-to-digital conversion method of claim 8, further comprising:
- receiving and perform conversion on the analog input signal to generate the digital conversion result by a first analog-to-digital conversion circuit comprised by the first stage conversion circuit;
- performing conversion on the digital conversion result to generate an analog output signal by a digital-to-analog conversion circuit comprised by the second stage conversion circuit;
- calculating a difference between the analog output signal and the analog input signal to generate the analog residue, and further adding the pseudo-noise to the analog residue to generate a first added result by a residue calculation circuit comprised by the second stage conversion circuit;
- amplifying the first added result according to the gain parameter to generate an analog amplified signal by an amplification circuit comprised by the second stage conversion circuit; and
- performing conversion on the analog amplified signal to generate the digital residue by a second analog-to-digital conversion circuit comprised by the second stage conversion circuit.

10. The analog-to-digital conversion method of claim 8, further comprising:
- generating the pseudo-noise by a pseudo-noise generation circuit such that the second stage conversion circuit, the gain calculation circuit and the output calculation circuit receive the pseudo-noise.

11. The analog-to-digital conversion method of claim 8, further comprising:
- adding the digital conversion result and the pseudo-noise to generate a second added result by a first adder comprised by the output calculation circuit;
- amplifying the second added result according to the compensation gain value to generate an amplified digital conversion result by a compensation calculation circuit comprised by the output calculation circuit; and
- adding the amplified digital conversion result and the digital residue to generate the digital output signal by a second adder comprised by the output calculation circuit.

12. The analog-to-digital conversion method of claim 8, wherein the gain parameter and the analog residue has a curvilinear correlation therebetween, and the output code intervals and the interval gain values are configured to approximate the curvilinear correlation.

13. The analog-to-digital conversion method of claim 12, wherein the output code intervals comprise a centermost output code interval and a plurality of outwards output code intervals, each of outwards output code intervals comprises a pair of sub-intervals disposed at two opposite sides of the centermost output code interval;

the outwards output code intervals are distributed in turn around the centermost output code interval that serves as a center; and each of the output code intervals corresponds to one of the interval gain values.

14. The analog-to-digital conversion method of claim 13, further comprising:

controlling the first stage conversion circuit to operate from a highest output resolution of the first output resolutions to a lowest output resolution of the first output resolutions and recording the output code ranges and the gain values in a sequential order by the control circuit;

based on the sequential order, determining a range of each of output code intervals according to a boundary output code difference of corresponding two of the output code ranges and generating each of the interval gain values by performing calculation on at least one of the gain values of the corresponding two of the output code ranges and the boundary output code difference by the control circuit.

* * * * *